（12） United States Patent
Hwangbo (10) Patent No.: US 10,347,676 B2
(45) Date of Patent: Jul. 9, 2019

(54) IMAGE SENSOR HAVING OPTICAL BLACK REGION AND METHOD FOR DARK LEVEL COMPENSATION USING THE SAME

(71) Applicant: SK hynix Inc., Gyeonggi-do (KR)

(72) Inventor: Kwang Hwangbo, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/709,930

(22) Filed: Sep. 20, 2017

(65) Prior Publication Data

US 2018/0261640 A1    Sep. 13, 2018

(30) Foreign Application Priority Data

Mar. 10, 2017    (KR) ........................ 10-2017-0030528

(51) Int. Cl.
*H01L 27/146*    (2006.01)
*H04N 5/369*    (2011.01)
*H04N 5/361*    (2011.01)
*H04N 5/3745*    (2011.01)

(52) U.S. Cl.
CPC ....... *H01L 27/14623* (2013.01); *H04N 5/361* (2013.01); *H04N 5/36963* (2018.08); *H04N 5/3745* (2013.01)

(58) Field of Classification Search
CPC .......... H01L 27/14623; H04N 5/36963; H04N 5/361; H04N 5/3745

USPC ......................................................... 348/245
See application file for complete search history.

(56) References Cited

U.S. PATENT DOCUMENTS

| 7,999,866 | B2 * | 8/2011 | Sonoda | H04N 5/361 |
| | | | | 348/241 |
| 8,227,734 | B2 | 7/2012 | Kameda | |
| 8,975,569 | B2 * | 3/2015 | Yamazaki | H04N 5/378 |
| | | | | 250/208.1 |
| 2009/0046180 | A1 * | 2/2009 | Shibano | H04N 5/361 |
| | | | | 348/243 |
| 2009/0122167 | A1 * | 5/2009 | Noh | H04N 5/361 |
| | | | | 348/243 |
| 2011/0013052 | A1 * | 1/2011 | Yanai | H04N 5/361 |
| | | | | 348/243 |
| 2011/0019036 | A1 * | 1/2011 | Okado | H04N 5/361 |
| | | | | 348/243 |

FOREIGN PATENT DOCUMENTS

| JP | 2005175930 | * | 6/2005 |
| KR | 1020090092380 | | 9/2009 |
| KR | 1020120002786 | | 1/2012 |

* cited by examiner

*Primary Examiner* — Albert H Cutler
(74) *Attorney, Agent, or Firm* — IP & T Group LLP (57) ABSTRACT

An image sensor may include: an active pixel region in which a plurality of active pixels are arranged; and one or more optical black regions positioned adjacent to the active pixel region, and each including a first region in which a plurality of first pixels are arranged and a second region in which a plurality of second pixels having a different pixel size from the first pixels are arranged.

20 Claims, 5 Drawing Sheets

IMAGE SENSOR HAVING OPTICAL BLACK REGION AND METHOD FOR DARK LEVEL COMPENSATION USING THE SAME

CROSS-REFERENCE TO RELATED APPLICATIONS

This application claims priority under 35 U.S.C. § 119 to Korean Patent Application No. 10-2017-0030528 filed on Mar. 10, 2017, the disclosure of which is herein incorporated by reference in its entirety.

TECHNICAL FIELD

Exemplary embodiments of the present invention relate to a semiconductor device fabrication technology, and more particularly, to an image sensor having an optical black region and a method for dark level compensation using the same.

DISCUSSION OF THE RELATED ART

An image sensor refers to a device that converts an optical image into an electrical signal. Recently, due to developments in the computer and communication industries, the demand for an enhanced image sensor with a high integration density is increasing in various devices such as a digital camera, camcorder, personal communication system (PCS), game machine, security camera, medical micro-camera and robots.

SUMMARY

Various embodiments are directed to an enhanced image sensor.

In an embodiment, an image sensor may include: an active pixel region in which a plurality of active pixels are arranged; and one or more optical black regions positioned adjacent to the active pixel region, and each including a first region in which a plurality of first pixels are arranged and a second region in which a plurality of second pixels having a different pixel size from the first pixels are arranged. The image sensor may further include a dark signal comparator suitable for comparing a dark signal outputted from the active pixel region and a dark signal outputted from the optical black region, and transmitting the comparison result to a row driver.

Each of the active pixel region and the first and second regions of the optical black region may be extend in a row direction, and the active pixel region and the first and second regions may be arranged in a column direction. The optical black region may be positioned at one side or the other side of the active pixel region or positioned at both sides of the active pixel region in a column direction. The plurality of active pixels and the plurality of first pixels may have the same pixel size. The number of first pixels in the first region may be equal to the number of second pixels in the second region. Each of the active pixels and the first and second pixels may include a photoelectric conversion element.

In an embodiment, there is provided an image sensor including an active pixel region in which a plurality of active pixels are arranged and one or more optical black regions positioned adjacent to the active pixel region. The optical black region may include: a first region in which a plurality of first pixels having the same pixel size as the plurality of active pixels are arranged; a second region in which a plurality of second pixels having a different pixel size from the plurality of first pixels are arranged; and a third region in which a plurality of third pixels having a different pixel size from the plurality of first and second pixels are arranged. The image sensor may further include a dark signal comparator suitable for comparing a dark signal outputted from the active pixel region and a dark signal outputted from the optical black region, and transmitting the comparison result to a row driver.

Each of the active pixel region and the first to third regions of the optical black region may be extend in a row direction, and the active pixel region and the first to third regions may be arranged in a column direction. The optical black region may be positioned at one side or the other side of the active pixel region or positioned at both sides of the active pixel region in a column direction. The number of first pixels in the first region, the number of second pixels in the second region, and the number of third pixels in the third region may be equal to each other. Each of the active pixels, the first pixels, the second pixels and the third pixels may include a photoelectric conversion element. The plurality of second pixels may have a larger pixel size than the plurality of first pixels, and the plurality of third pixels may have a smaller pixel size than the plurality of first pixels.

In an embodiment, there is provided a dark level compensation method of an image sensor which includes: an active pixel region in which a plurality of active pixels are arranged and an optical black region including a first region in which a plurality of first pixels are arranged and a second region in which a plurality of second pixels having different pixel size than the plurality of first pixels are arranged. The dark level compensation method may include: measuring a dark signal of the active pixel region; measuring a dark signal of the first region and a dark signal of the second region in the optical black region, respectively; and determining whether a first difference between the dark signal of the first region and the dark signal of the active pixel region falls within a preset error range, wherein when the first difference falls within the preset error range, the plurality of first pixels are driven during dark level compensation. The dark level compensation method may further include determining whether a second difference between the dark signal of the second region and the dark signal of the active pixel region falls within the preset error range, when the first difference is out of the preset error range, wherein when the second difference falls within the preset error range, the plurality of second pixels are driven during dark level compensation.

Each of the active pixel region and the first and second regions of the optical black region may be extend in a row direction, and the active pixel region and the first and second regions may be arranged in a column direction. The plurality of active pixels and the plurality of first pixels may have the same pixel size. The number of first pixels in the first region may be equal to the number of second pixels in the second region. Each of the active pixels and the first and second pixels may include a photoelectric conversion element.

DETAILED DESCRIPTION

Various embodiments will be described below in more detail with reference to the accompanying drawings. The drawings may not be necessarily to scale and in some instances, proportions of at least some of the structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure for example, one or more additional layers may be present between two illustrated layers. As a specific example, when a first layer in a described or illustrated multi-layer structure is referred to as being "on" or "over" a second layer or "on" or "over" a substrate, the first layer may be directly formed on the second layer or the substrate but may also represent a structure in which one or more other intermediate layers may exist between the first layer and the second layer or the substrate.

Various embodiments provide an enhanced image sensor. Specifically, the various embodiments provide a method capable of improving the characteristics of a dark level compensation operation in an image sensor including an optical black pixel for compensating for a dark signal of an active pixel.

A pixel array of the image sensor may include an active pixel region having a plurality of active pixels and an optical black region having a plurality of optical black pixels. Each of the active pixels may generate an output signal based on a photo charge which is generated in response to incident light and a thermal charge which is thermally generated in the pixel. On the other hand, each of the optical black pixels may include a light shielding member, for example, a metal film covering the top of each of the optical black pixels, in order to shield incident light. Each of the optical black pixels cannot generate a photo charge in response to incident light. That is, each of the optical black pixels may generate an output signal based on only a thermal charge generated therein. At this time, a current caused by the thermal charge may be referred to as 'dark current', and an output signal based on the thermal charge may be referred to as 'dark signal'. Therefore, the image sensor may prevent characteristic degradation caused by a dark current through a dark level compensation operation which subtracts an output signal of the optical black region from an output signal of the active pixel region.

Ideally, for the normal dark level compensation operation, an output signal based on a thermal charge generated in the active pixel region must be equal to an output signal based on a thermal charge generated in the optical black region. That is, for a normal dark level compensation operation, a value obtained by subtracting a dark signal outputted from the optical black region from a dark signal outputted from the active pixel region needs to fall within a preset error range. However, with the recent increase in integration density of image sensors, an error in process may occur to cause a difference between an output signal based on a photo charge generated in the active pixel region and an output signal based on a thermal charge generated in the optical black region. Therefore, the dark level compensation operation cannot be normally performed. For example, when the optical signal of the optical black region or the dark signal of the optical black region is larger, the output signal of the active pixel region may disappear in a low illumination environment, or the sensitivity of the image sensor may be reduced. On the other hand, when the dark signal of the optical black region is smaller, the dark signal of the optical black region cannot offset the dark signal of the active pixel region, thereby degrading the characteristic based on a dark current.

Therefore, the various embodiments provide an image sensor which is capable of normally performing a dark level compensation operation even though a difference occurs between an output signal based on a photo charge generated in an active pixel region and an output signal based on a photo charge generated in an optical black region, and a dark level compensation method using the same.

Figure 1:
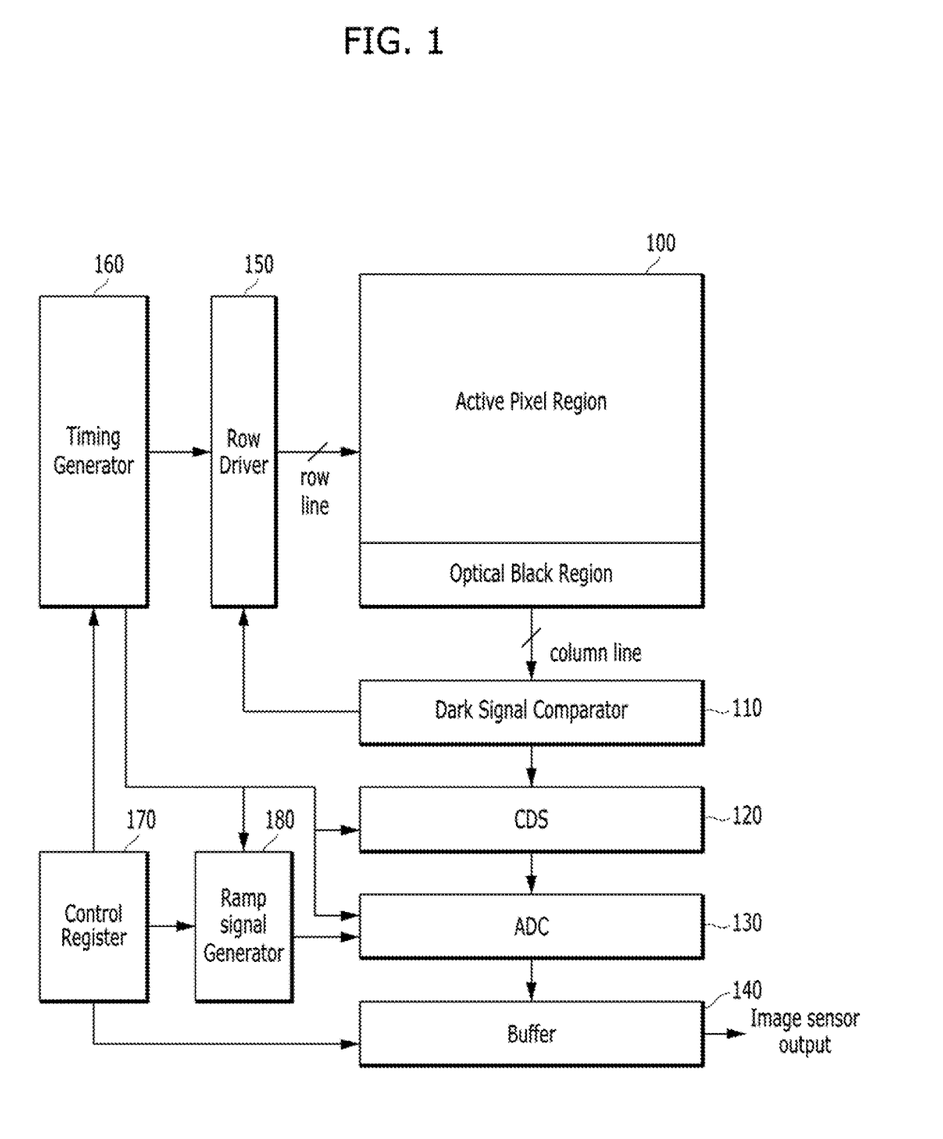
FIG. 1 is a block diagram illustrating an image sensor in accordance with an embodiment.

FIG. 1 is a block diagram illustrating an image sensor in accordance with an embodiment.

Referring to FIG. 1, the image sensor in accordance with the present embodiment may include a pixel array 100, a dark signal comparator 110, a correlated double sampling (CDS) unit 120, an analog-to-digital converter (ADC) 130, a buffer 140, a row driver 150, a timing generator 160, a control register 170 and a ramp signal generator 180. The pixel array 100 may include a plurality of pixels arranged in a matrix structure.

The pixel array 100 may include an active pixel region and one or more optical black regions. The active pixel region may include a plurality of active pixels. Each of the optical black regions may include a plurality of optical black pixels for compensating for dark signals of the plurality of active pixels.

The dark signal comparator 110 may compare an output signal based on a thermal charge generated in the active pixel region to an output signal based on a thermal charge generated in the optical black region. That is, the dark signal comparator 110 can compare a dark signal of the active pixel region to a dark signal of the optical black region, and transmit the comparison result to the row driver 150. Although it is shown that the dark signal comparator 110 may be positioned in front of the correlated double sampling unit 120, the dark signal comparator 110 may be positioned within the correlated double sampling unit 120.

The timing generator 160 may generate one or more control signals for controlling the respective operations of the row driver 150, the correlated double sampling unit 120, the analog-to-digital converter 130 and the ramp signal generator 180. The control register 170 may generate one or more control signals for controlling the respective operations of the ramp signal generator 180, the timing generator 160 and the buffer 140.

The row driver 150 may drive the pixel array 100 by the unit of row line. For example, the row driver 150 may generate a select signal for selecting any one row line among a plurality of row lines. The plurality of row lines are coupled with the plurality of pixels, respectively. One row line is coupled to each of the plurality of pixels.

Each of the plurality of pixels senses incident light, and outputs an image reset signal and an image signal to the correlated double sampling unit 120 through a column line and the dark signal comparator 110. The correlated double sampling unit 120 may perform sampling for each of the image reset signal and the image signal received therein. The plurality of pixels are coupled to a plurality of column lines, respectively. One column line is coupled to each of the plurality of pixels. The analog-to-digital converter 130 may compare a ramp signal which is outputted from the ramp signal generator 180 and a sampling signal which is outputted from the correlated double sampling unit 120, and output a comparison signal. The analog-to-digital converter 130 may count a level transition time of the comparison signal according to a clock signal which is provided from the timing generator 160, and output a count value to the buffer 140. The ramp signal generator 180 may operate under control of the timing generator 160.

The buffer 140 may store a plurality of digital signals which are outputted from the analog-to-digital converter 130, sense and amplify the respective digital signals, and output resultant signals as an output of the image sensor. Thus, the buffer 140 may include a memory (not shown) and a sense amplifier (not shown). The memory may store count values, and the count values mean the count values associated with the signals outputted from the plurality of pixels. The sense amplifier may sense and amplify the respective count values which are outputted from the memory.

Figure 2:
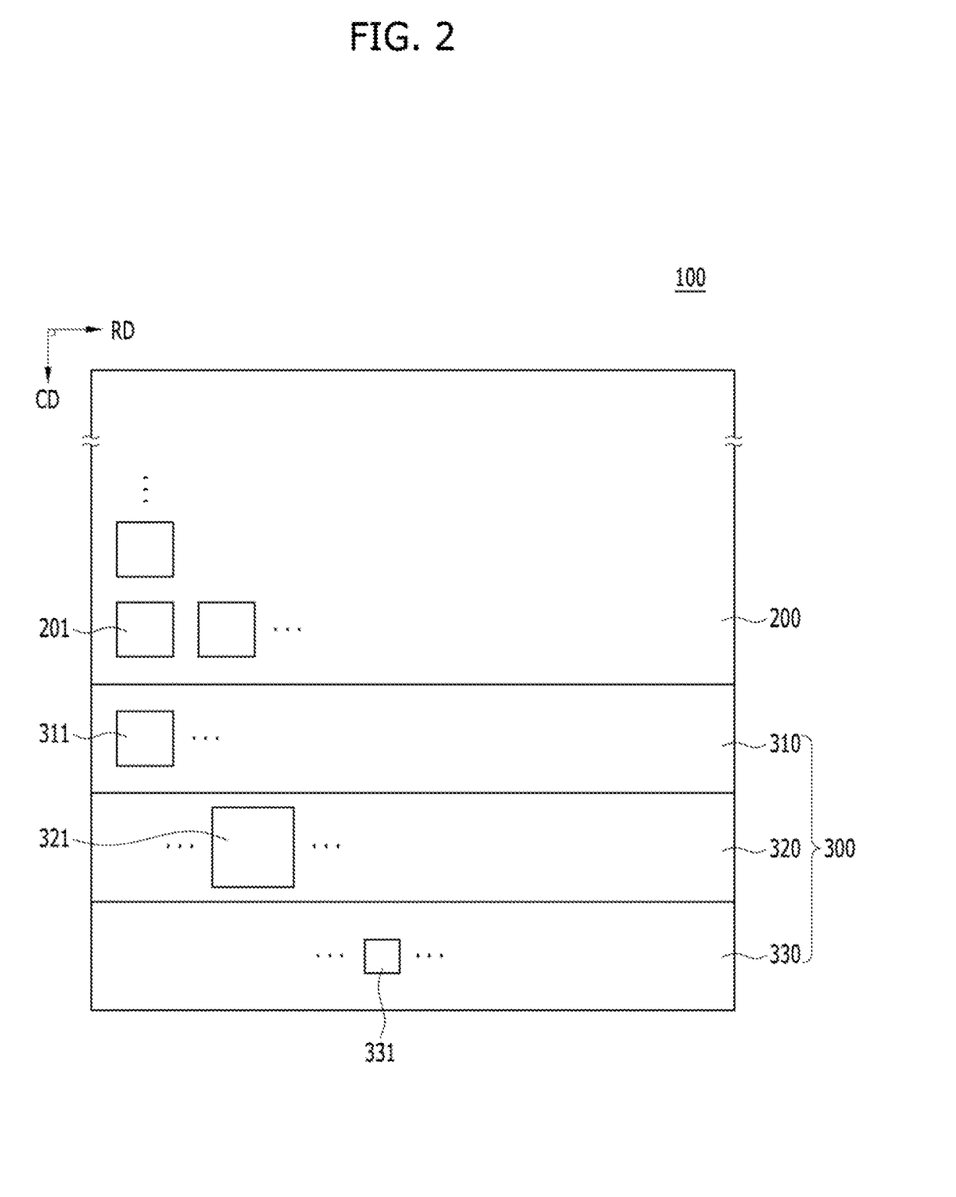
FIG. 2 is a diagram illustrating a pixel array of an image sensor in accordance with an embodiment.

FIG. 2 is a diagram illustrating a pixel array 100 of an image sensor in accordance with an embodiment.

Referring to FIG. 2, the pixel array 100 may include an active pixel region 200 and an optical black region 300 adjacent to the active pixel region 200. The optical black region 300 may be in contact with a boundary line of the active pixel region 200, the boundary line extending in the row direction RD. Each of the active pixel region 200 and the optical black region 300 extends in a row direction, and the active pixel region 200 and the optical black region 300 are arranged in a column direction. The active pixel region 200 and the optical black region 300 may be electrically coupled to each other through a plurality of conductive lines. Between the active pixel region 200 and the optical black region 300, a dummy pixel region may be positioned. FIG. 2 exemplifies that the optical black region 300 is positioned under the active pixel region 200 in a column direction CD, but the present embodiment is not limited thereto. Alternatively, the optical black region 300 may be positioned above the active pixel region 200 in the column direction CD. Furthermore, although described later, the optical black region 300 may be positioned above and under the active pixel region 200 in the column direction CD (refer to FIGS. 3 and 4).

The active pixel region 200 may include a plurality of active pixels 201 arranged in a matrix structure. The plurality of active pixels 201 may have a square planar shape. Each of the active pixels 201 may include a photoelectric conversion element for generating a photo charge in response to incident light and a plurality of transistors for generating an output signal corresponding to the photo charge generated by the photoelectric conversion element. The photoelectric conversion element may include a photodiode. The plurality of transistors may include a transfer transistor, a reset transistor, a driver transistor and a selection transistor.

The optical black region 300 may include a first region 310 having a plurality of first pixels 311 arranged therein, a second region 320 having a plurality of second pixels 321 arranged therein, and a third region 330 having a plurality of third pixels 331 arranged therein. The optical black region 300 may include a light shielding member for shielding incident light, and the plurality of first pixels 311, the plurality of second pixels 321 and the plurality of third pixels 331 may be positioned under the light shielding member. The number of first pixels 311 in the first region 310, the number of second pixels 321 in the second region 320 and the number of third pixels 331 in the third region 330 may be equal to each other. This is in order to implement a consistent operation characteristic even though any region in the optical black region 300 is selected for a normal dark compensation operation.

Each of the active pixel region 200 and first to third regions 310 to 330 of the optical black region 300 extends in a row direction, and the active pixel region 200 and first to third regions 310 to 330 are arranged in a column direction. In the optical black region 300, the first to third regions 310 to 330 may be in contact with boundary lines therebetween, the boundary lines extending in the row direction RD. In the column direction CD, the first region 310 may be positioned the most adjacent to the active pixel region 200, and the third region 330 may be positioned the farthest away from the active pixel region 200. The second region 320 may be positioned between the first and third regions 310 and 330. FIG. 2 exemplifies that the first to third regions 310 to 330 are sequentially arranged, but the present embodiment is not limited thereto. That is, the arrangement order of the first to third regions 310 to 330 in the column direction CD is not limited to a specific case.

The plurality of first pixels 311 constituting the first region 310 may have the same planar shape and pixel size as the plurality of active pixels 201. For example, the plurality of first pixels 311 and the plurality of active pixels 201 may have a square planar shape. The plurality of first pixels 311 may have the same pixel components as the plurality of active pixels 201. That is, each of the first pixels 311 may include a photoelectric conversion element and a plurality of transistors for generating an output signal corresponding to a photo charge generated by the photoelectric conversion element, like the plurality of active pixels 201. Since the plurality of first pixels 311 and the plurality of active pixels 201 have the same pixel size, the photoelectric conversion element and the plurality of transistors in each of the first pixels 311 may have the same size as those in each of the active pixels 201.

The plurality of second pixels 321 and the plurality of third pixels 331 may have the same planar shape as the plurality of first pixels 311. Alternatively, the plurality of second pixels 321 and the plurality of third pixels 331 may have different pixel sizes from the plurality of first pixels 311. Due to the same pixel shape and the different pixel size above, it is possible to acquire output signals different from an output signal based on a thermal charge generated in the first region 310. That is, due to the same pixel shape and the different pixel size above, it is possible to acquire dark signals having different magnitudes from a dark signal in the first region 310. Specifically, when the output signal based on the thermal charge generated in the first region 310 is larger or smaller than the output signal based on the thermal charge generated in the active pixel region 200, an output signal based on a thermal charge in the second or third region 320 or 330 instead of the first region 310 may be used to compensate for the dark signal of the active pixel region 200.

The plurality of second pixels 321 constituting the second region 320 may have the same planar shape as the plurality of first pixels 311, but have a larger pixel size than the plurality of first pixels 311. When the plurality of second pixels 321 have the same planar shape as the plurality of first pixels 311 but have a different pixel size from the plurality of first pixels 311, a thermal charge generated in a pixel may be limited only by a change of the pixel size. For example, the plurality of second pixels 321 may have a square planar shape, and have a twice larger size than the plurality of first pixels 311. Thus, the output signal based on the thermal charge generated in the second region 320 may be larger than the output signal based on the thermal charge generated in the first region 310. Therefore, when the output signal based on the thermal charge generated in the first region 310 is smaller than the output signal based on the thermal charge generated in the active pixel region 200, the output signal based on the thermal charge generated in the second region 320 instead of the first region 310 may be used to compensate for the dark signal of the active pixel region 200. Then, the dark level compensation can be normally performed.

The plurality of second pixels 321 may have the same pixel components as the plurality of first pixels 311. That is, each of the second pixels 321 may include a photoelectric conversion element and a plurality of transistors for generating an output signal corresponding to a photo charge generated by the photoelectric conversion element. With the increase of the pixel size, the size of the photoelectric conversion element and the sizes of the plurality of transistors in each of the second pixels 321 may be increased at the same time, or only the size of the photoelectric conversion element may be increased. In the latter case, the plurality of transistors in each of the second pixels 321 may have the same size as those in each of the first pixels 311.

The plurality of third pixels 331 constituting the third region 330 may have the same planar shape as the plurality of first pixels 311, but have a smaller pixel size than the plurality of first pixels 311. When the plurality of third pixels 331 have the same planar shape as the plurality of first pixels 311 but have a different pixel size from the plurality of first pixels 311, due to the same pixel shape and the different pixel size above, a thermal charge which generated in a pixel may be limited only to a change of the pixel size. For example, the plurality of third pixels 331 may have a square planar shape, and have a size corresponding to ½ of the size of the first pixels 311. Thus, the output signal based on the thermal charge generated in the third region 330 may be smaller than the output signal based on the thermal charge generated in the first region 310. Therefore, when the output signal based on the thermal charge generated in the first region 310 is larger than the output signal based on the thermal charge generated in the active pixel region 200, the output signal based on the thermal charge generated in the third region 330 instead of the first region 310 may be used to compensate for the dark signal of the active pixel region 200. Then, the dark level compensation can be normally performed.

The plurality of third pixels 331 may have the same pixel components as the plurality of first pixels 311. That is, each of the third pixels 331 may include a photoelectric conversion element and a plurality of transistors for generating an output signal corresponding to a photo charge generated by the photoelectric conversion element. With the decrease of the pixel size, the size of the photoelectric conversion element and the sizes of the plurality of transistors in each of the third pixels 331 may be decreased at the same time, or only the size of the photoelectric conversion element may be decreased. In the latter case, the plurality of transistors in each of the third pixels 331 may have the same size as those in each of the first pixels 311.

FIG. 2 exemplifies that the optical black region 300 includes the first to third regions 310 to 330, but the present embodiment is not limited thereto. Alternatively, the optical black region 300 may further include regions each having a plurality of pixels which have the same planar shape as and a different pixel size from the plurality of first pixels 311, in addition to the second and third regions 320 and 330.

In accordance with the first embodiment, since the optical black region 300 includes the plurality of regions and the output signals based on thermal charges generated in the respective regions are different from each other, the dark level compensation can be normally performed even though a difference occurs between the output signal based on the thermal charge generated in the active pixel region 200 and the output signal based on the thermal charge generated in the optical black region 300. That is, a characteristic degradation caused by a dark current can be effectively prevented.

Figure 3:
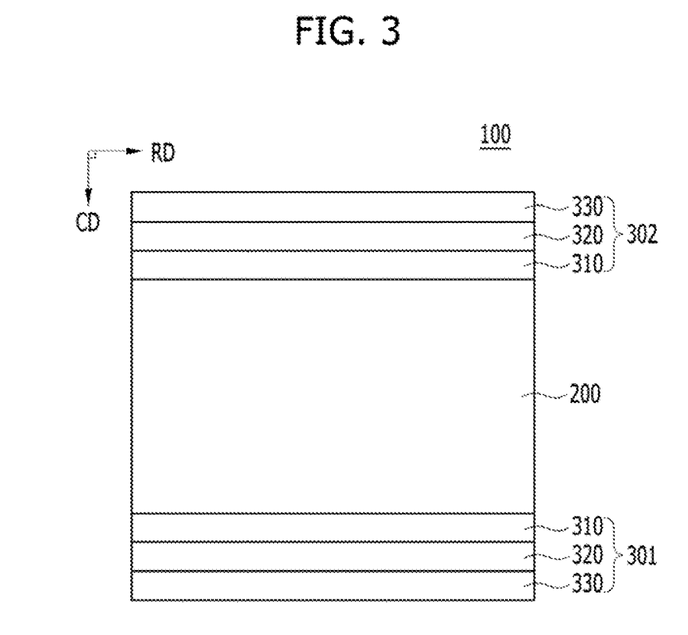
FIG. 3 is a diagram illustrating a pixel array of an image sensor in accordance with an embodiment.

FIG. 3 is a diagram illustrating a pixel array 100 of an image sensor in accordance with an embodiment. For convenience of description, like reference numerals will be used for the same components as those of the first embodiment, and the detailed descriptions of the same components are omitted herein.

Referring to FIG. 3, the pixel array 100 of the image sensor in accordance with the second embodiment may include an active pixel region 200 and one or more optical black regions 301 and 302 adjacent to the active pixel region 200. Specifically, the pixel array 100 may include the active pixel region 200, a first optical black region 301 located adjacent to one side of the active pixel region 200, and a second optical black region 302 located adjacent to the other side of the active pixel region 200. The first and second optical black regions 301 and 302 may be in contact with boundary lines of the active pixel region 200, respectively, the boundary lines extending in the row direction RD. Therefore, in the column direction CD, the first optical black region 301 may be positioned under the active pixel region 200, and the second optical black region 302 may be positioned above the active pixel region 200. The active pixel region 200 and the first and second optical black regions 301 and 302 may be electrically coupled to each other through a plurality of conductive lines. Between the active pixel region 200 and the first and second optical black regions 301 and 302, dummy pixel regions may be positioned.

Each of the first and second optical black regions 301 and 302 may include first to third regions 310 to 330. In each of the first and second optical black regions 301 and 302, the first region 310 may be positioned the most adjacent to the active pixel region 200 in the column direction CD, and the third region 330 may be positioned the farthest away from the active pixel region 200 in the column direction CD. In the first and second optical black regions 301 and 302, the second region 320 may be positioned between the first and third regions 310 and 330. Therefore, according to the arrangement of the first to third regions 310 to 330, the first and second optical black regions 301 and 302 may be symmetrical with each other based on the active pixel region 200.

Figure 4:
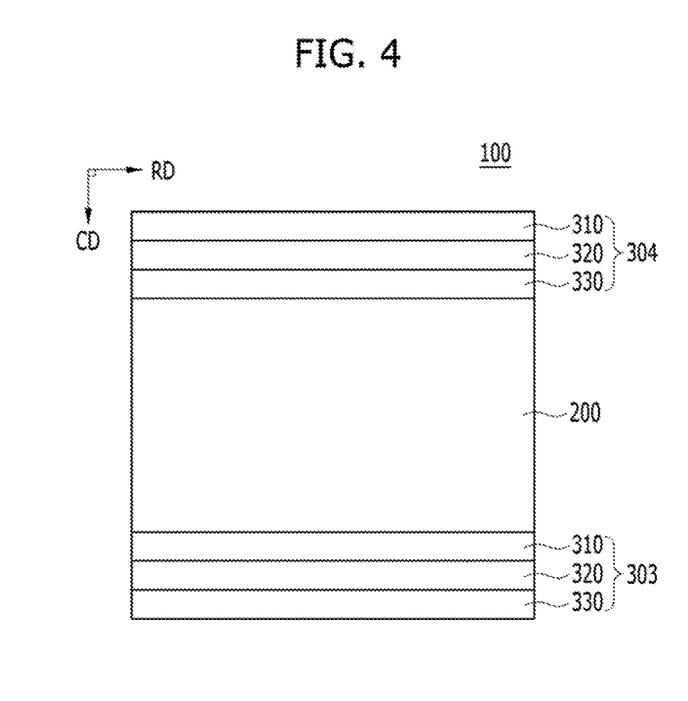
FIG. 4 is a diagram illustrating a pixel array of an image sensor in accordance with an embodiment.

FIG. 4 is a diagram illustrating a pixel array 100 of an image sensor in accordance with an embodiment. For convenience of description, like reference numerals will be used for the same components as those of the first embodiment, and the detailed descriptions of the same components are omitted herein.

Referring to FIG. 4, the pixel array 100 of the image sensor in accordance with the third embodiment may include an active pixel region 200 and one or more optical black regions 303 and 304 adjacent to the active pixel region 200. Specifically, the pixel array 100 may include the active pixel region 200, a first optical black region 303 positioned adjacent to one side of the active pixel region 200, and a second optical black region 304 positioned adjacent to the other side of the active pixel region 200. The first and second optical black regions 303 and 304 may be in contact with boundary lines of the active pixel region 200, respectively, the boundary lines extending in the row direction RD. Therefore, in the column direction CD, the first optical black region 303 may be positioned under the active pixel region 200, and the second optical black region 304 may be positioned above the active pixel region 200. The active pixel region 200 and the first and second optical black regions 303 and 304 may be electrically coupled to each other through a plurality of conductive lines. Between the active pixel region 200 and the first and second optical black regions 303 and 304, dummy pixel regions may be positioned.

Each of the first and second optical black regions 303 and 304 may include first to third regions 310 to 330. In the first optical black region 303, the first region 310 may be positioned the most adjacent to the active pixel region 200 in the column direction CD, and the third region 330 may be positioned the farthest away from the active pixel region 200 in the column direction CD. Alternatively, in the second optical black region 304, the third region 330 may be positioned the most adjacent to the active pixel region 200 in the column direction CD, and the first region 310 may be positioned the farthest away from the active pixel region 200 in the column direction CD. In the first and second optical black regions 303 and 304, the second region 320 may be positioned between the first and third regions 310 and 330. Therefore, according to the arrangement of the first to third regions 310 to 330, the second optical black region 304 may have a shape corresponding to the inverted shape of the first optical black region 303, based on the active pixel region 200.

As described above, the image sensors in accordance with the second and third embodiments may include the plurality of optical black regions 301 and 302 and 303 and 304, and can increase the total number of optical black pixels, thereby improving the speed and reliability of the dark level compensation operation.

Hereafter, a dark level compensation method in the image sensor having the optical black region and the dark signal comparator will be described with reference to FIGS. 1, 2 and 5.

Figure 5:
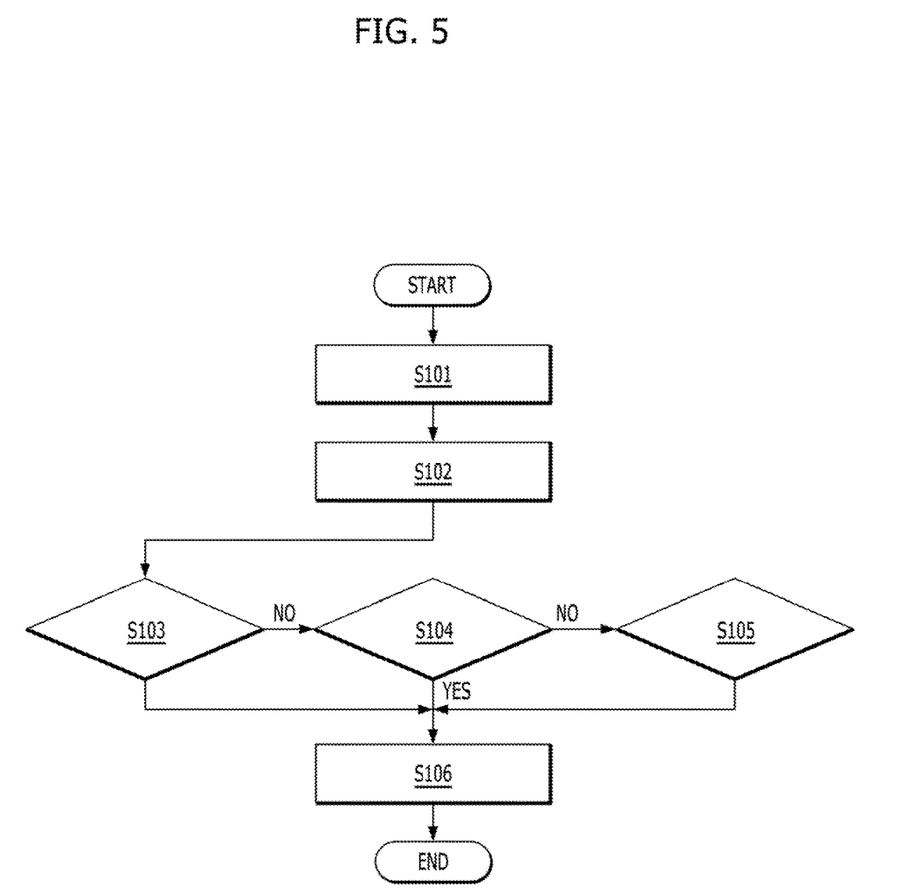
FIG. 5 is a flowchart illustrating a dark level compensation method for an image sensor in accordance with an embodiment.

FIG. 5 is a flowchart illustrating a dark level compensation method of an image sensor in accordance with an embodiment.

Referring to FIGS. 1, 2 and 5, the dark level compensation method in accordance with the present embodiment will be described. The dark level compensation method may start with step S101 of measuring a dark signal outputted from the active pixel region 200 in an environment where incident light is shielded. That is, an output signal based on a thermal charge generated in the active pixel 201 may be measured in the environment where incident light is shielded. At this time, the measured dark signal of the active pixel region 200 may be stored in the dark signal comparator 110.

Then, dark signals outputted from the optical black region 300 may be measured at step S102. Specifically, a dark signal outputted from the first region 310, a dark signal outputted from the second region 320, and a dark signal outputted from the third region 330 may be measured in the optical black region 300, respectively. At this time, the measured dark signal of the first region 310, the measured dark signal of the second region 320 and the measured dark signal of the third region 330 may be stored in the dark signal comparator 110. Due to the same pixel shape and the different pixel size above, the dark signal of the second region 320 may be the largest, and the dark signal of the third region 330 may be the smallest.

Then, the dark signal comparator 110 may determining whether a first difference between the dark signal of the first region 310 and the dark signal of the active pixel region 200 falls within a preset error range, at step S103. At this time, when the first difference falls within the preset error range, the dark signal comparator 110 may transmit the determination result to the row driver 150, and the row driver 150 may drive the first region 310 in the optical black region 300, that is, the plurality of first pixels 311 during dark level compensation, at step S106.

On the other hand, when the first difference is out of the preset error range, the dark signal comparator 110 may determine whether a second difference between the dark signal of the second region 320 and the dark signal of the active pixel region 200 falls within the preset error range, at step S104. At this time, when the second difference falls within the preset error range, the dark signal comparator 110 may transmit the determination result to the row driver 150, and the row driver 150 may drive the second region 320 in the optical black region 300, that is, the plurality of second pixels 321 during dark level compensation, at step S106.

On the other hand, when the second difference is out of the preset error range, the dark signal comparator 110 may determine whether a third difference between the dark signal of the third region 330 and the dark signal of the active pixel region 200 falls within the preset error range, at step S105. At this time, when the third difference falls within the preset error range, the dark signal comparator 110 may transmit the determination result to the row driver 150, and the row driver 150 may drive the third region 330 in the optical black region 300, that is, the plurality of third pixels 331 during dark level compensation, at step S106.

As described above, the optical black region 300 including the first to third regions 310 to 330 may output a plurality of dark signals having different magnitudes, and the dark signal comparator 110 may compare the dark signal of the active pixel region 200 to the dark signals of the first to third regions 310 to 330, and select a dark signal of the optical black region 300, which has a magnitude corresponding to the dark signal of the active pixel region 200. Thus, the dark level compensation can be normally performed. That is, a characteristic degradation caused by a dark current can be effectively prevented.

The image sensor in accordance with the above-described embodiments may be used in various electronic devices or systems. Hereafter, a case in which the image sensor in accordance with the embodiments is applied to a camera will be described with reference to FIG. 6.

Figure 6:
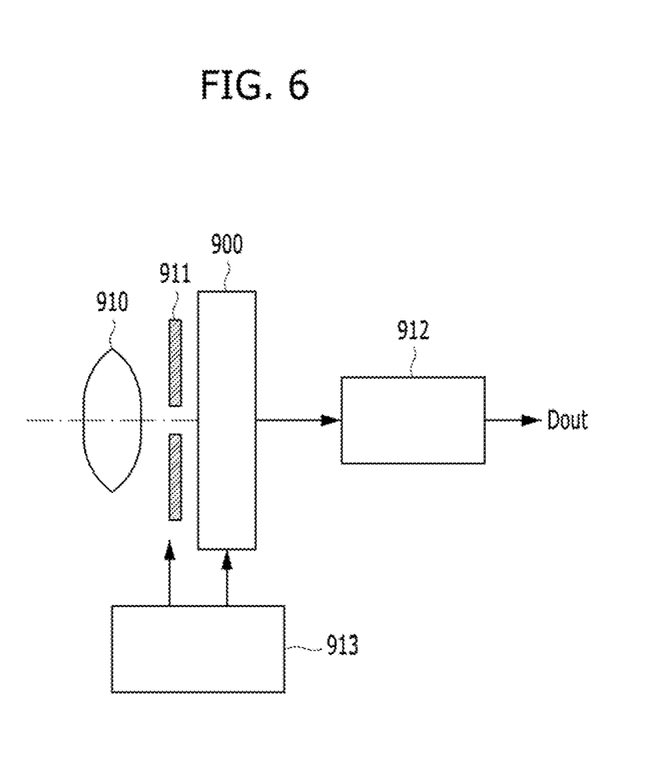
FIG. 6 is a diagram illustrating an example of an electronic device including an image sensor in accordance with various embodiments.

FIG. 6 is a diagram illustrating an example of an electronic device including an image sensor in accordance with various embodiments.

Referring to FIG. 6, the electronic device including the image sensor in accordance with the embodiments may be a camera capable of taking a still image or a moving picture.

The electronic device may include an image sensor 900, an optical system or optical lens 910, a shutter unit 911, an image sensor 900, a signal processing unit 912 and a driving unit 913. The driving unit 913 may control and/or drive the image sensor 900, the shutter unit 911, and the signal processing unit 912.

The optical system 910 may guide image light or incident light from an object (not shown), to a pixel array (see the reference numeral 100 of FIG. 1) of the image sensor 900. The optical system 910 may be constructed by a plurality of optical lenses. The shutter unit 911 may control a light irradiation period and a light shielding period for the image sensor 900. The driving unit 913 may control the transmission operation of the image sensor 900 and the shutter operation of the shutter unit 911. The signal processing unit 912 may perform various kinds of signal processing for the signal outputted from the image sensor 900. An image signal Dout after signal processing by the signal processing unit 912 may be stored in a storage medium such as a memory or be outputted to a monitor or the like.

As is apparent from the above descriptions, in the present technology, since the optical black region 300 includes the plurality of regions and the output signals based on thermal charges generated in the respective regions are different from each other, the dark level compensation can be normally performed even though a difference occurs between the output signal based on the thermal charge generated in the active pixel region 200 and the output signal based on the thermal charge generated in the optical black region 300. That is, a characteristic degradation caused by a dark current can be effectively prevented.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
   an active pixel region in which a plurality of active pixels are arranged; and
   one or more optical black regions positioned adjacent to the active pixel region, and each comprising a first region in which a plurality of first pixels are arranged and a second region in which a plurality of second pixels having a different pixel size from the first pixels are arranged,
   wherein the plurality of active pixels and the plurality of first pixels have the same pixel size,
   wherein the active pixels provide a first dark signal and the first pixels provide a second dark signal, when a first difference between the first dark signal and the second dark signal falls within a preset error range, the first pixels are driven during dark level compensation.

2. The image sensor of claim 1, further comprising a dark signal comparator suitable for comparing the first dark signal outputted from the active pixel region and the second dark signal outputted from the optical black region, and transmitting the comparison result to a row driver.

3. The image sensor of claim 1, wherein each of the active pixel region and the first and second regions of the optical black region extends in a row direction, and the active pixel region and the first and second regions are arranged in a column direction.

4. The image sensor of claim 1, wherein the optical black region is positioned at one side or the other side of the active pixel region or positioned at both sides of the active pixel region in a column direction.

5. The image sensor of claim 1, wherein the number of first pixels in the first region is equal to the number of second pixels in the second region.

6. The image sensor of claim 1, wherein each of the active pixels and the first and second pixels comprises a photoelectric conversion element.

7. The image sensor of claim 1, wherein the second pixels provide a third dark signal,
   when the first difference is out of the preset error range and a second difference between the third dark signal and the second dark signal falls within the preset error range, the second pixels are driven during the dark level compensation.

8. An image sensor comprising an active pixel region in which a plurality of active pixels are arranged and one or more optical black regions positioned adjacent to the active pixel region,
   wherein the optical black region comprises:
   a first region in which a plurality of first pixels having the same pixel size as the plurality of active pixels are arranged;
   a second region in which a plurality of second pixels having a different pixel size from the plurality of first pixels are arranged; and
   a third region in which a plurality of third pixels having a different pixel size from the plurality of first and second pixels are arranged,
   wherein the plurality of active pixels and the plurality of first pixels have the same pixel size,
   wherein the active pixels provide a first dark signal and the first pixels provides a second dark signal, when a first difference between the first dark signal and the second dark signal falls within a preset error range, the first pixels are driven during dark level compensation.

9. The image sensor of claim 8, further comprising a dark signal comparator suitable for comparing the first dark signal outputted from the active pixel region and the second dark signal outputted from the optical black region, and transmitting the comparison result to a row driver.

10. The image sensor of claim 8, wherein each of the active pixel region and the first to third regions of the optical black region extends in a row direction, and the active pixel region and the first to third regions are arranged in a column direction.

11. The image sensor of claim 8, wherein the optical black region is positioned at one side or the other side of the active pixel region or positioned at both sides of the active pixel region in a column direction.

12. The image sensor of claim 8, wherein the number of first pixels in the first region, the number of second pixels in the second region, and the number of third pixels in the third region are equal to each other.

13. The image sensor of claim 8, wherein each of the active pixels, the first pixels, the second pixels and the third pixels comprises a photoelectric conversion element.

14. The image sensor of claim 8, wherein the plurality of second pixels have a larger pixel size than the plurality of first pixels, and the plurality of third pixels have a smaller pixel size than the plurality of first pixels.

15. The image sensor of claim 8, wherein the second pixels provide a third dark signal,
   when the first difference is out of the preset error range and a second difference between the third dark signal and the second dark signal falls within the preset error range, the second pixels are driven during the dark level compensation.

16. A dark level compensation method for an image sensor, comprising:
- providing an active pixel region in which a plurality of active pixels are arranged and an optical black region including a first region in which a plurality of first pixels are arranged and a second region in which a plurality of second pixels having different pixel size than the plurality of first pixels are arranged;
- measuring a dark signal of the active pixel region;
- measuring a dark signal of the first region and a dark signal of the second region in the optical black region, respectively; and
- determining whether a first difference between the dark signal of the first region and the dark signal of the active pixel region falls within a preset error range,
- wherein when the first difference falls within the preset error range, the plurality of first pixels are driven during dark level compensation,
- wherein the plurality of active pixels and the plurality of first pixels have the same pixel size.

17. The dark level compensation method of claim 16, further comprising determining whether a second difference between the dark signal of the second region and the dark signal of the active pixel region falls within the preset error range, when the first difference is out of the preset error range, wherein when the second difference falls within the preset error range, the plurality of second pixels are driven during dark level compensation.

18. The dark level compensation method of claim 16, wherein each of the active pixel region and the first and second regions of the optical black region extends in a row direction, and the active pixel region and the first and second regions are arranged in a column direction.

19. The dark level compensation method of claim 16, wherein the number of first pixels in the first region is equal to the number of second pixels in the second region.

20. The dark level compensation method of claim 16, wherein each of the active pixels and the first and second pixels comprises a photoelectric conversion element.

* * * * *